US009631291B2

(12) United States Patent
Scott et al.

(10) Patent No.: US 9,631,291 B2
(45) Date of Patent: Apr. 25, 2017

(54) CONTROLLING DIMENSIONS OF NANOWIRES (71) Applicant: HEWLETT-PACKARD DEVELOPMENT COMPANY, L.P., Houston, TX (US)

(72) Inventors: Graeme Scott, Maynooth (IE); Kevin Dooley, Blessington (IE); Lorraine Byrne, Dublin (IE); Pat J. Reilly, Drogheda (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 475 days.

(21) Appl. No.: 13/752,868

(22) Filed: Jan. 29, 2013

(65) Prior Publication Data
US 2014/0209469 A1 Jul. 31, 2014

(51) Int. Cl.
*C25D 1/04* (2006.01)
*C25D 1/00* (2006.01)
*B82Y 40/00* (2011.01)

(52) U.S. Cl.
CPC .............. *C25D 1/04* (2013.01); *C25D 1/006* (2013.01); *B82Y 40/00* (2013.01)

(58) Field of Classification Search
CPC ........... C25D 1/04; C25D 1/006; B82Y 40/00
USPC ....................................................... 205/118
See application file for complete search history.

(56) References Cited

U.S. PATENT DOCUMENTS

| 2005/0176228 A1* | 8/2005 | Fonash ................ B81C 1/0019 438/597 |
| 2009/0184311 A1 | 7/2009 | Steinberg |
| 2009/0197209 A1 | 8/2009 | Penner et al. |
| 2010/0007827 A1 | 1/2010 | Nishimura et al. |

FOREIGN PATENT DOCUMENTS

WO WO-2008018923 A2 2/2008

OTHER PUBLICATIONS

Lee, B-C., et al., "Thickness-controlled Metal Nanoscale Etch for Proposed Metal Nanowires Fabrication", NSTI-Nanotech, 007, vol. 1. p. 270-282.*
Seley, D.B., et al., "Electroplate and Lift Lithography for Patterned Micro/Nanowires Using Ultrananocrystalline Diamond (UNCD) as a Reusable Template", Applied Materials and Interfaces, 2011, 3, p. 925-930.*
Briseno, A.L., et al., "Fabrication of Field-Effect Transistors from Hexathiapentacene Single-Crystal Nanowires", Nano Letters, 2007, vol. 7 No. 3, p. 668-675.*
Kuila et al., "Fabrication of oriented polyaniline nanostructures using block copolymer nanotemplates and their optical, electrochemical and electric properties", Journal of Materials Chemistry, 2010, 20, 6086-6094.*

(Continued)

*Primary Examiner* — Louis Rufo
(74) *Attorney, Agent, or Firm* — Fabian Vancott (57) ABSTRACT

Controlling dimensions of nanowires includes lithographically forming a trench in a layer of a polymer resin with a width less than one micrometer where the polymer resin has a thickness less than one micrometer and is deposited over an electrically conductive substrate, depositing a nanowire material within the trench to form a nanowire, and obtaining the nanowire from the trench with a removal mechanism.

15 Claims, 5 Drawing Sheets

(56) References Cited

OTHER PUBLICATIONS

Kim et al., "Fabrication of Layer-by-Layer Assembled Bio-Architecture on Gold Nanorods", Journal of Korean Physical Society, vol. 33, No. 2 Aug. 2008, pp. 886-891.*

Anandakumar et al., "Template Synthesis of Cobalt Nanowires Using PS-b-PMMA Block Copolymer", IEEE Transations on magnetics, vol. 45, No. 10, Oct. 2009.*

Lahav et al., "Core-shell and segmented polymer-metal composite nanostructures", Nano Letters, 2006, vol. 6, No. 9, 2166-2171.*

B. Erenturk, et al., "Formation of Crystalline Cadmium Selenide Nanowires", Chemistry of Materials, 2011, 23, 3371-3376.*

Osuji, R.U., "Analysis of Chemically Deposited CdSe and CdS Thin Films", United Nations Education Scientific and Cultural Organization and International Atomic Energy Agency, 2002.*

Majidi, H., et al., Electrodeposition of CdSe coatings on ZnO nanowire arrays for extremely thin absorber solar cells, Electrochimica Acta, 56, 2011, p. 2703-2711.*

Chengiang Xiang et al; Cheating the Diffraction Limit: Electrodeposited Nanowires Patterned by Photolithography; ChemComm—www.rsc.org/chemcomm; Jan. 06, 2009; pp. 859-873.

Chenxiang Xiang, et al; Lithographically Patterned nanowire Electodeposition: A Method for Patterning Electrically Continous Metal Nanowires on Dielectrics; ACSNANO—www.acsnano.org, Sep. 23, 2008, vol. 2 No. 9, pp. 1939-1949.

J.M.Park et al; Laser Interference Lithography for Fabricating Nanowires and Nanoribbons; Nanowires—Implementations and Applications—http://www.intechopen.com; Jul. 2011; Dr. Abbass Hashim (Ed.), ISBN: 978-953-307-318-7, InTech.

Jared Burdick et al; High-Throughput Templated Multisegment Synthesis of Gold Nanowires and Nanorods; Nanotechnology 20—IOP Publishing; Jan. 14, 2009; pp. 1-6.

Jaya Sarkar et al; Nanowires: Properties, Applications and Synthesis via Porous Anodic Aluminium Oxide Template; Indian Academy of Sciences; Bull. Mater. Sci., vol. 30, No. 3.

S. Aravanmudhan et al; Magnetic Properties of Ni—Fe Nanowire Arrays: Effect of Template Material and Deposition Conditions; Journal of Physcis D: Applied Physics; May 24, 200.

S. Aravanmudhan et al; Porous Silicon Templates for Electrodeposition of Ananostructures' Applied Physics A; Appl. Phys. A 87—DOI 10.1007/s00339-007-3901-4; Jan. 12, 2007.

* cited by examiner

CONTROLLING DIMENSIONS OF NANOWIRES

BACKGROUND

Nanosized particles behave differently than those particles made of the same material with larger dimensions. For example, some nanosized particles exhibit different colors, melting temperatures, magnetic properties, and/or electrical properties. Nanosized particles generally exhibit these different attributes due to the particles' increased surface area to bulk material ratio. Any particle with one of its dimensions, such as height, width, or length, in the nano-scale is generally classified as a nanosized particle.

Nanowires are wires with a width in the nanometer scale. Nanowires also exhibit different characteristics than their larger counterparts. For example, electrical conduction in nanowires generally creates less heat than in larger wires of the same material. Further, many nanowires exhibit just discrete values of electrical conductance.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

Forming nanowires at a production volume with precise dimensions (i.e. the length, width, height, and aspect ratio) is difficult to achieve at a reasonable price, especially for long nanowires. The principles described herein include forming trenches with techniques based on photolithography and subsequently using an electroplating process to form nanowires within the trenches so that the resulting nanowires are made with precisely controlled dimensions and with aspect ratios of greater than 1000. Nanowires made according to these principles are readily scalable to volume production. When the trenches are formed with a low cost lithography process, the overall production cost is kept within a reasonable range. The method for controlling the nanowires' dimensions includes lithographically forming a trench in a layer of a polymer resin with a width less than one micrometer where the polymer resin has a thickness less than one micrometer and is deposited over an electrically conductive substrate, depositing a nanowire material within the trench to form a nanowire, and obtaining the nanowire from the trench with a removal mechanism.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
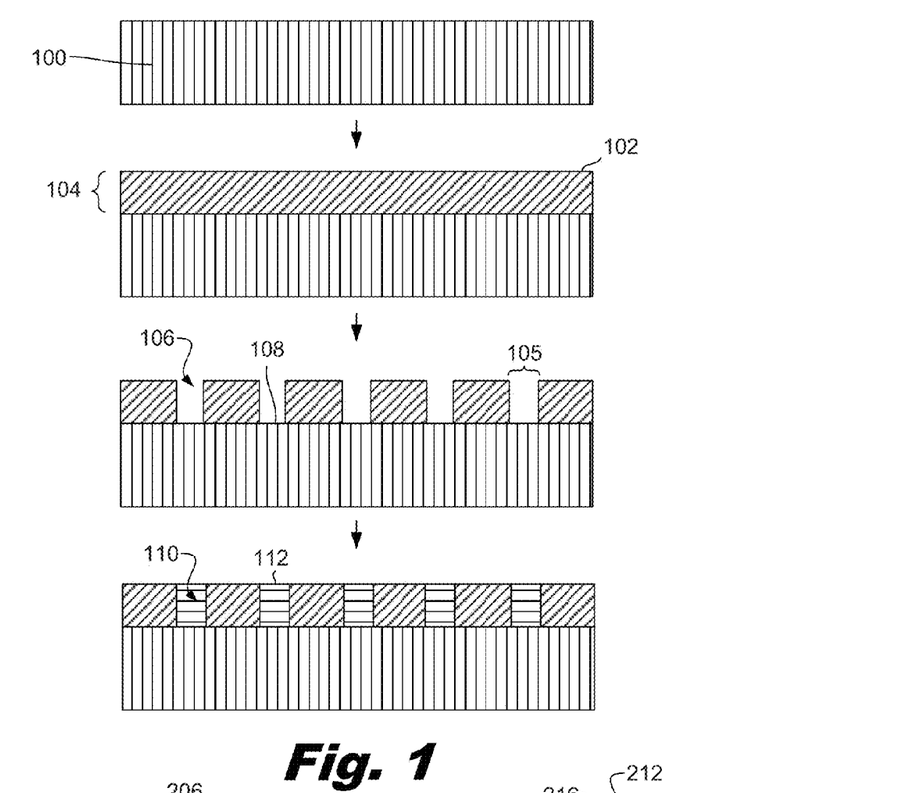
FIG. 1 is a diagram of an example of manufacturing nanowires according to principles described herein.

FIG. 1 is a diagram of an example of manufacturing a nanowire according to principles described herein. In this example, the manufacturing process includes forming an electrically conductive substrate (100). Any appropriate electrically conductive material may be used to make the electrically conductive substrate (100). For example, a non-exhaustive list of electrically conductive materials includes copper, gold, silver, iron, titanium, nickel, tungsten, cobalt, steel, other metals, mixtures thereof, alloys thereof, oxides thereof, other electrically conductive materials, or combinations thereof.

In a second stage of the manufacturing process, the conductive substrate (100) is coated with a thin layer of a patternable polymer resin (102). The layer's thickness (104) is less than a micrometer. The patternable polymer resin (102) can be an ultraviolet or thermally curable material.

In a third stage of the manufacturing process, the patternable polymer resin (102) is patterned to form trenches (106) with a sub-micrometer width (105). These trenches (106) can be linear for straight nanowires or have various shapes and curves to form other desired shapes and/or patterns for other types of nanowires. Any appropriate lithography process may be used to form the trenches (106) in the polymer resin (102). For example, a nanoimprint lithography process, which will be described in more detail later, can form trenches (106) with a width of less than fifty nanometers. Also, laser lithography techniques can be used. Initial testing showed that laser lithography formed trenches with a width of 250 nanometers (limited by the wavelength of the laser light source). Other appropriate lithography techniques suitable for forming the trenches (106) include x-ray lithography, which can form trenches with a width of approximately 150 nanometers; scanning probe lithography, which can form trenches with a width of approximately twenty three nanometers; electron beam lithography, which can form trenches with a width of less than fifty nanometers, other lithography techniques, or combinations thereof.

In some examples, the trenches (106) are lithographically formed such that a surface (108) of the electrically conductive substrate (100) is exposed. In other examples, an additional sub-process is performed to remove residual polymer resist material from the base of the trenches (106) to expose the underlying conductive surface (108). The additional sub-process may include using a plasma ash treatment. The plasma ash treatment may involve using a plasma source to create a reactive material that causes the polymer resist (102) to form an ash that is removable with a vacuum or other removal mechanism.

In a fourth stage of the manufacturing process, a nanowire material (110), such as a metal, is deposited in the trenches (106) through an electroplating process to form nanowires (112). Suitable electroplating processes compatible with the principles described herein include direct current electroplating, pulse electroplating, reverse electroplating, other forms of electroplating, or combinations thereof. In alternative examples, an electroless deposition process is used to form the nanowires (112) in the trenches. An electroless deposition process may be desirable for forming each of the nanowires (112) at the same rate or to produce nanowires with an alloy material.

Following the formation of the nanowires (112) in the trenches (106), the nanowires (106) are removed with a removal mechanism. Suitable removal mechanisms will be described in more detail later.

Figure 2:
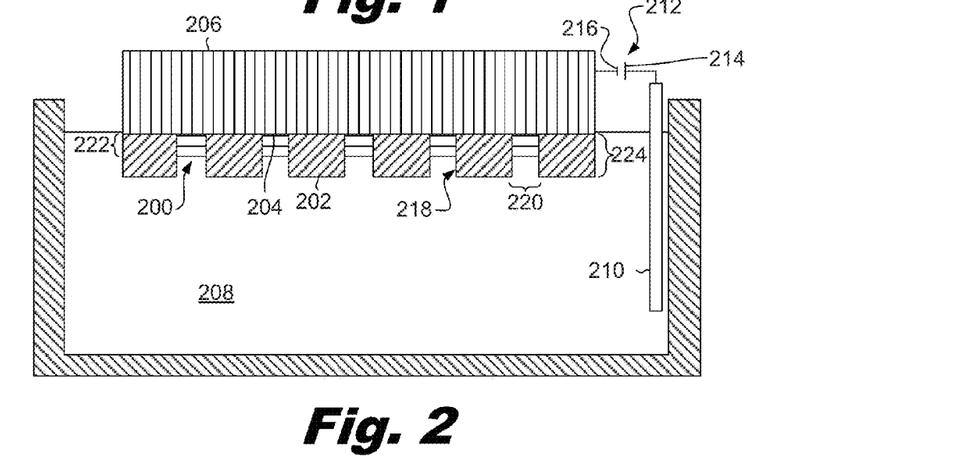
FIG. 2 is a diagram of an example of forming nanowires with an electroplating process according to principles described herein.

FIG. 2 is a diagram of an example of forming nanowires (200) with an electroplating process according to principles described herein. In this example, the polymer resin (202) and the surface (204) of the electrically conductive substrate (206) are in contact with a solution (208). An anode (210) is also placed in contact with a solution containing the plating ions. (208). Both the electrically conductive substrate (206), which is the cathode, and the anode (210) are in electrical contact with an external power source (212). The anode (210) is electrically connected to the positive terminal (214) of the external power source (212) and the electrically conductive substrate (206) is electrically connected to the negative terminal (216). When the external power source (212) is turned on, an electrochemical reaction involving the solution and the electrically conductive substrate's surface (204) causes the deposition of the plating ions to bond to the surface (204) of the electrically conductive substrate (206) in the trenches (218) to form the nanowires (200). In some examples, the anode (210) is the source of the plating ions, while in other examples, the ions are in the solution.

In other examples, an electroless deposition process is used to deposit the nanowire material into the trenches. In such an example, no external power source or anode is used. However, the solution (208) contains a reducing agent, which drives nanowire material ions in the solution to bond to the surface (204) of the electrically conductive substrate (206) in the trenches (218).

The dimensions of the nanowires (200) are controlled with both the lithography process and the plating (either electroplating or electroless plating) process. The length and width (220) of the nanowires (200) are controlled with the length and width of the trenches (218). The height (222) of the nanowires is controlled with the duration and current settings of the plating process. For example, the height (222) of the nanowire (200) may be proportional to the duration of the plating process. The plating process may last long enough to cause the height of the nanowires to be approximately the same as the thickness (224) of the polymer resin (202), less than the thickness (224) of the polymer resin (202), or more than the thickness (204) of the polymer resin (202). However, in examples where the nanowire's height (222) exceeds the thickness (224) of the polymer resin (202), the portion of the nanowire (200) protruding beyond the polymer resin (202) is no longer confined to the width of the trenches and, therefore, is no longer controllable with the width of the trenches' width.

Figure 3:
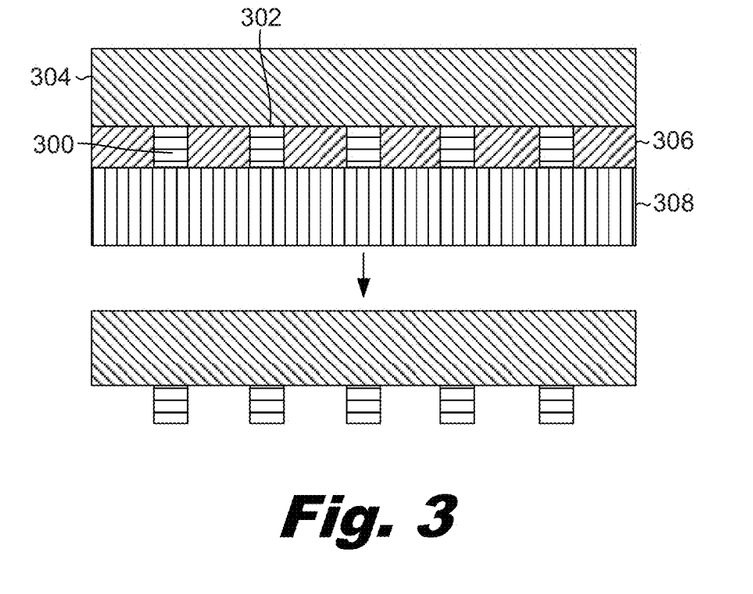
FIG. 3 is a diagram of an example of removing nanowires according to principles described herein.

FIG. 3 is a diagram of an example of removing nanowires (300) according to principles described herein. In this example, the exposed surfaces (302) of the nanowires (300) are bonded to a second substrate (304). In some examples, the polymer resin (306) is also bonded to the second substrate (304), while in other examples, just the exposed surfaces (302) of the nanowires (300) are bonded to the second substrate (304). As the second substrate (304) is pulled away from the first substrate (308), the nanowires (300) are peeled away from the first substrate (308).

This approach is well suited to nanowire arrays and specific patterns that include features such as interdigitated capacitors, diffraction gratings, other complex features, or combinations thereof. The second substrate (308) may be a substrate intended to be incorporated into a device or system that utilizes the nanowires (300). Thus, the use of the second substrate (304) eliminates subsequent tasks of depositing the recovered nanowires to the intended substrate. In some examples, such as example where the nanowires (300) are to be incorporated into a display panel, the second substrate (304) is a transparent substrate. The second substrate (304) may also include features, such as electrodes, and the nanowires (300) create an electrically conductive pathway between such electrodes. In other examples, other features are joined to the second substrate (304) after the nanowires (300) are removed. The second substrate (304) may be an electrical insulator.

Devices that incorporate the nanowires (300) may include circuit boards, computer chips, transistors, memristors, memory elements, transparent conductors, circuits, processors, other devices, or combinations thereof. Systems that incorporate the nanowires (300) may include personal computers, laptops, electronic tablets, phones, watches, displays, active matrixes, monitors, passive matrixes, cameras, instrumentation, global positioning units, photovoltaic panels, medical instrumentation, other systems, or combinations thereof.

Figure 4:
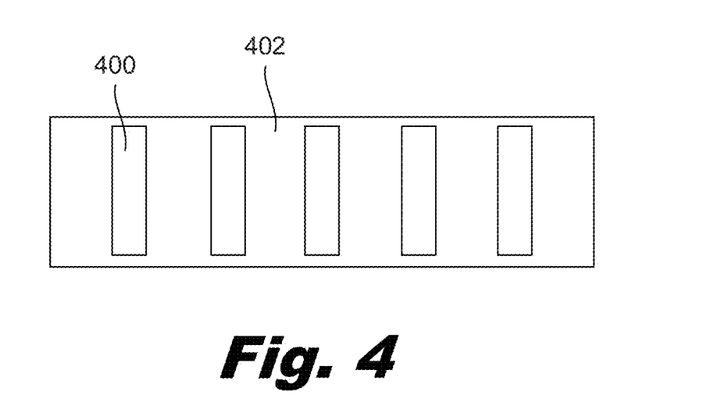
FIG. 4 is a diagram of an example of nanowires according to principles described herein.

FIG. 4 is a diagram of an example of nanowires (400) according to principles described herein. In this example, the nanowires (400) are bonded to a substrate (402), such as a second substrate (304, FIG. 3). In such examples, the substrate (402) may include other circuit elements or have space to add additional circuit elements. The nanowires (400) can join the circuit elements to form more complex circuits. Further, the peeling removal mechanism described in conjunction with FIG. 3 may cause the nanowires (400) to have precise orientations and locations on the substrate (402). As a result, the nanowires (400) can be placed with precision onto the substrate and/or circuit. Further, such a removal mechanism allows for precise spacing between the nanowires (400).

Figure 5:
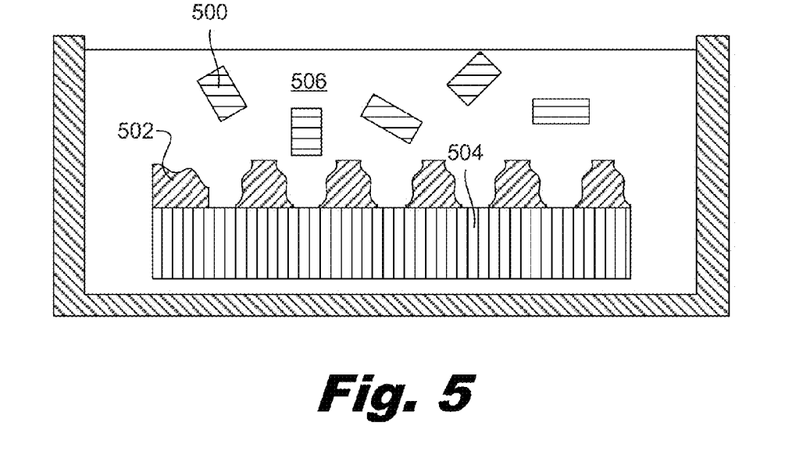
FIG. 5 is a diagram of an example of removing nanowires from a substrate according to principles described herein.

FIG. 5 is a diagram of an example of removing nanowires (500) from a substrate according to principles described herein. In this example, the nanowires (500) are removed from the polymer resin (502) and the electrically conductive substrate (504) by degrading the polymer resin (500) with a solvent (506).

In this approach, the electrically conductive substrate (504), the polymer resin (502), and the nanowires (500) are placed in a suitable solvent that causes the polymer resin (502) to swell and dissolve. In this process, the nanowires (500) become dislodged from the electrically conductive substrate (504) and are dispersed in the solvent (506). In some examples, to fully ensure complete transfer of the nanowires (500) from the electrically conductive substrate (500) mechanical or ultrasonic agitation is used. Alternatively the polymer resin can be plasma etched to leave behind the nanowire structures.

Once dispersed in the solvent (506), the nanowires (500) are redeposited onto another substrate to form the final nanowire network. A range of liquid deposition techniques can be used for this process including drop casting, spin coating, ink-jet printing, micro-contact printing, spraying, and other processes, or combinations thereof.

Figure 6:
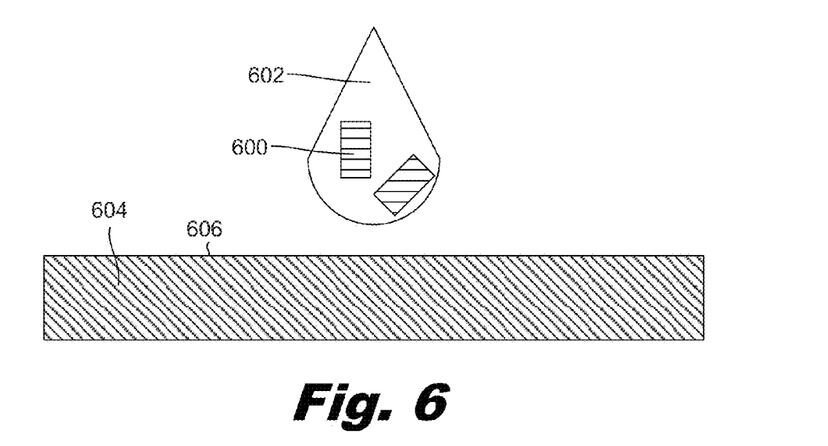
FIG. 6 is a diagram of an example of depositing nanowires according to principles described herein.

FIG. 6 is a diagram of an example of depositing nanowires (600) according to principles described herein. In this example, the nanowires (600) are suspended in a droplet (602) of a liquid carrier that has been released over another substrate (604). While just two nanowires (600) are depicted in the droplet (602) in the example of FIG. 6, any appropriate number of nanowires may be suspended with the droplet (602). The number of the nanowires capable of being suspended within the droplet (602) is dependent on the droplet's size and the sizes of the nanowires (600) themselves.

The droplet (602) containing the nanowires (600) may be produced with any appropriate process for depositing nanowires (600) onto a substrate (604). For example, a non-exhaustive list of processes for depositing nanowires with droplets (602) include drop casting processes, spraying processes, ink jet processes, other processes, or combinations thereof.

As the droplet (602) engages the surface (606) of the substrate (604), the droplet (602) spreads out and deposits the nanowires (600) on the substrate (604). The deposited nanowires (600) may be used as part of a circuit, to electrically connect electrodes, perform other functions, or combinations thereof. The nanowires (600) may bond or adhere to the surface (606) of the substrate (604) due to the innate chemical properties of the nanowire's materials and the substrate's materials. In other examples, the substrate's surface (606) is modified to promote adhesion and/or bonding.

Figure 7:
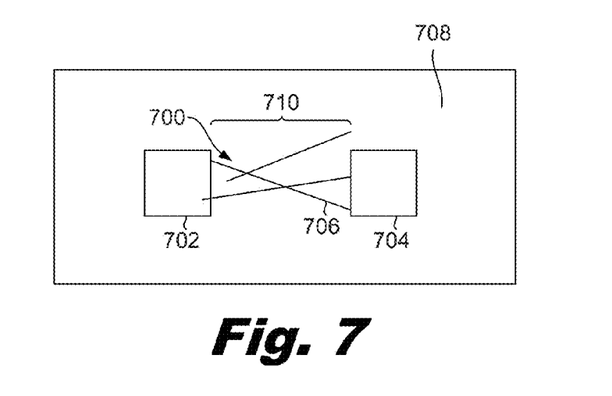
FIG. 7 is a diagram of an example of an electrically conductive pathway between a first and a second electrode according to principles described herein.

FIG. 7 is a diagram of an example of an electrically conductive pathway (700) between a first electrode (702) and a second electrode (704) according to principles described herein. Multiple nanowires (706) form the electrical pathway (700) that electrically connects the first and second electrodes (702, 704). The nanowires (706) were deposited with a procedure that involves suspending the nanowires (706) in a solution of carrier fluid and releasing a droplet of the solution containing the nanowires (706) onto the substrate's surface (708). Such a procedure may be part of a drop casting process, spraying process, ink jet process, other process, or combinations thereof.

As the droplet contacts the substrate's surface (708), the nanowires spread out onto the surface (708) between the first and the second electrode. In this example, at least one of the nanowires (706) is as long as the distance (710) between the first and the second electrodes. As a result, a single nanowire is capable of forming the electrical pathway (700) to electrically connect the first and the second electrodes (702, 704). However, some of the nanowires (706) deposited on the substrate's surface (708) may not contact both the first and the second electrode (702, 704) due to the fluid flow generated internally to the droplet as the liquid carrier evaporates. Thus, the number of nanowires (706) suspended in the droplet is high enough to have a high enough statistical probability that at least one or multiple nanowires (706) will form the electrical pathway. In another example, the nanowire material can be deposited across an entire surface. Conductivity and transparency can be tailored through the deposition parameters to form an electrically conductive surface to be used, for example, as transparent conductive films in display or photovoltaic applications.

An advantage of the principles described herein is that the nanowires (706) can be formed with aspect ratios of greater than 1000. As a result, the nanowires (706) can be made with precision with significantly longer lengths than with other methods. Consequently, a percolation threshold, which is the statistical number of nanowires (706) that must be suspended in the droplet to form the electrical pathway (700), can be significantly reduced. Thus, the percolation threshold is reduced for the nanowires (706) made according to the principles described herein. A lower number of nanowires to form the electrical pathway improves the performance of the electrical pathway, improves reliability, saves materials, reduces cost, and provides greater flexibility to meet other circuit parameters.

Figure 8:
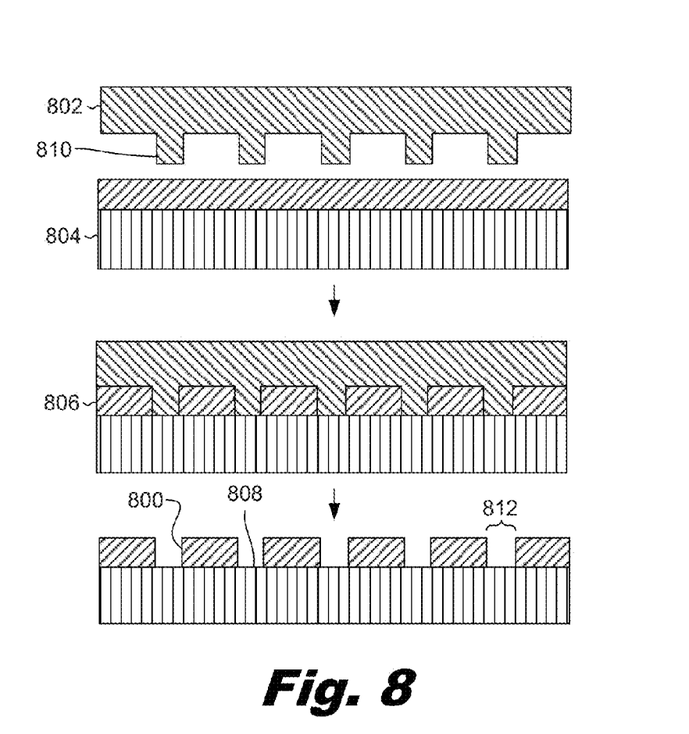
FIG. 8 is a diagram of an example of forming trenches according to principles described herein.

FIG. 8 is a diagram of an example of forming trenches (800) according to principles described herein. In this example, a nanoimprint lithography technique is used. A stamp (802) is positioned over a substrate (804) that has a polymer resin (806) deposited over its surface (808). The stamp (802) has multiple protrusions (810) that are shaped to form trenches (800) in the polymer resin (806). The stamp (802) is moved into the polymer resin (806) with sufficient force to form an imprint that forms the trenches (800) in the polymer resin (806) through mechanical deformation. Such a nanoimprint lithography technique can form trenches (800) with a width (812) of at least one nanometer. The mechanical deformation caused by moving the stamp (802) into the polymer resin (806) may form the trenches (800) all the way to the surface (808) of the substrate (804). In other examples, the mechanical deformation forms the trenches (802) with a height shorter than the thickness of the polymer resin (806). Etching or another chemical process may be used to extend the height of the trenches (800) all the way through the thickness of the polymer resin (806).

Figure 9:
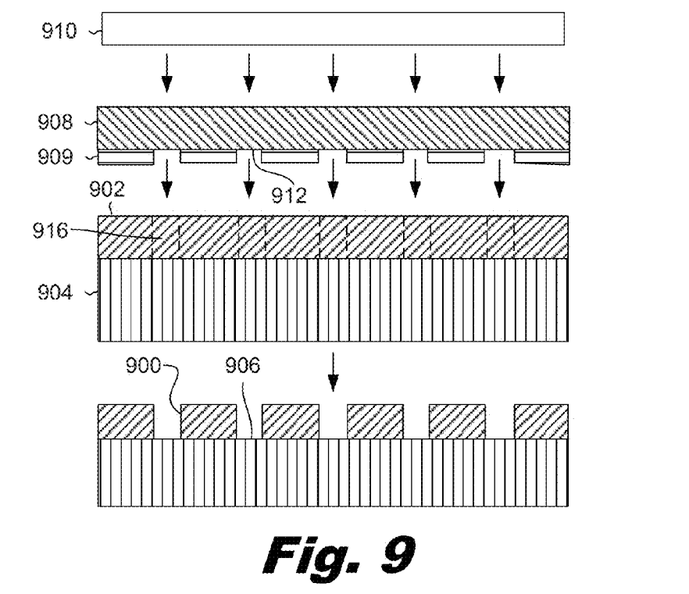
FIG. 9 is a diagram of an example of forming trenches according to principles described herein.

FIG. 9 is a diagram of an example of forming trenches (900) according to principles described herein. In this example, the polymer resin (902) is deposited over a surface (904) of the substrate (906). The polymer resin (902) is a photoresist material that changes its chemical characteristics in response to exposure to certain wavelengths of light, such as ultraviolet wavelengths. A non-exhaustive list of photoresist materials includes polymethyl methacrylate (PMMA), polymethyl glutarimide (PMGI), phenol formaldehyde resin, SU-8, epoxy based negative photoresist materials, other photoresist materials, and combinations thereof.

A light mask (908) is placed between the polymer resin (902) and a light source (910). The light source (910) may be a laser source, an ultraviolet light source, another type of light source capable of chemically altering the polymer resin (902), or combinations thereof. The light mask (908) is made of a transparent material that has metalized surface areas (909) and unmasked areas (912). The metalized surface areas (909) block rays emitted from the light source (910) and the unmasked areas (912) permit the passage of rays emitted from the light source. Thus, the portions of the polymer resin (902) aligned with the unmasked areas (912 of the light mask (908) are exposed to the rays from the light source (908) when the light source (910) is turned on.

The light rays chemically alter the exposed portions (916) of the polymer resin (902) such that these portions (916) are easily removed through sand blasting, flushing with a solvent, vacuum, another removal procedure, or combinations thereof. As the exposed portions (916) are removed, trenches (900) are formed that mimic the regions of the light mask (908) with the second thickness (914). As a result, the pattern formed on the light mask (908) with the second thickness (914) is transferred to the polymer resin (902) in the form of the trenches (900).

While examples above have been described with reference to nanoimprint lithography processes and specific laser lithography processes, any appropriate lithography process to form the trenches may be used. For example, other suitable lithography processes include x-ray lithography processes, scanning probe lithography processes, electron beam lithography processes, other lithography processes, or combinations thereof.

Figure 10:
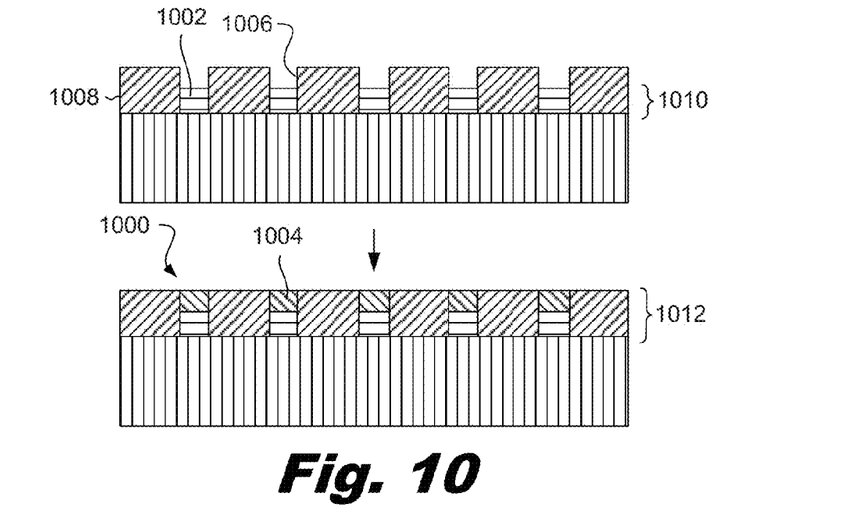
FIG. 10 is a diagram of an example of forming nanowires according to principles described herein.

FIG. 10 is a diagram of an example of forming nanowires (1000) according to principles described herein. In this example, the nanowires (1000) are formed with a first layer (1002) of nanowire material and a second layer (1004) of different nanowire material. The trenches (1006) may be formed in the polymer resin (1008) with any appropriate lithography procedure that precisely forms the length, width, and/or geometry of the trenches (1006).

During an initial sub-process of forming the nanowires (1000), the first layer (1002) of the nanowires (1000) is deposited through an electroplating or electroless process. The height (1010) of the first layer (1002) is precisely controlled with the duration of the electroplating or electroless process. During the initial sub-process, the duration and current of the electroplating or duration of electroless process causes the height (1010) of the first layer (1002) to be less than the thickness (1012) of the polymer resin (1008).

During a subsequent sub-process, the second layer (1004) is formed with a different nanowire material than the material of the first layer (1002) through another electroplating or electroless process. The different materials may each have different characteristics that are desirable for the nanowires (1000). Any appropriate nanowire material may be used for the first and/or second nanowire material.

While the example in FIG. 10 has been described with reference to two layers, any appropriate number of layers may be formed according to the principles described herein. Further, the layers may include different thicknesses and shapes.

Figure 11:
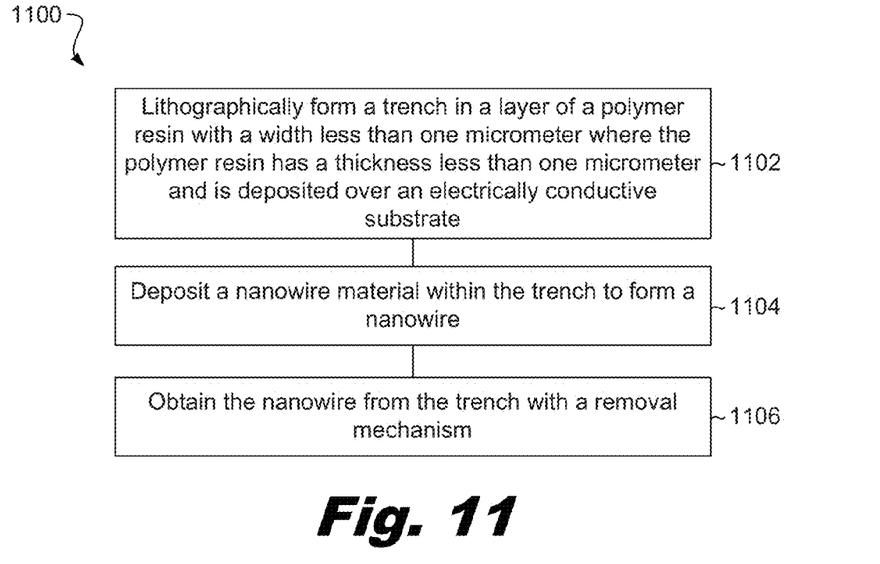
FIG. 11 is a diagram of an example of a method for controlling dimensions in nanowires according to principles described herein.

FIG. 11 is a diagram of an example of a method (1100) for controlling dimensions in nanowires according to principles described herein. In this example, the method (1100) includes lithographically forming (1102) a trench in a layer of a polymer resin with a width less than one micrometer where the polymer resin has a thickness less than one micrometer and is deposited over an electrically conductive substrate, depositing (1104) a nanowire material within the trench to form a nanowire, and obtaining (1106) the nanowire from the trench with a removal mechanism.

The method may also include forming an electrically conductive pathway between a first electrode and a second electrode that are spaced apart from one another by a distance on a substrate. The electrically conductive pathway can be formed by applying a liquid solution carrying at least one nanowire between the first and second electrode. As the solution dries, the nanowires remain on the substrate. At least one of the nanowires deposited on the substrate has a length that is at least as long as the distance between the first and second electrode.

Any appropriate lithography procedure may be used to form the trenches, such as with nanoimprint lithography, laser lithography, x-ray lithography, scanning probe lithography, electron beam lithography, other lithography procedures, or combinations thereof. The width of the trench is between 1 and 300 nanometers. The dimensions of the trench and therefore the dimensions of the corresponding nanowires can have aspect ratios of over 1000 when made according to the principles described herein.

The nanowire material is deposited into the trenches with either an electroplating process, electroless process, another appropriate process, or combinations thereof. In some examples, multiple layers of different nanowire materials are used to form the nanowires.

The nanowires may be removed from the polymer resin with any appropriate method. In some examples, the nanowires are removed from the substrate and the polymer resin by dissolving the substrate in a solvent. In other examples, the nanowires are obtained by peeling the polymer resin and the nanowires away from the electrically conductive substrate. The polymer resin and the nanowires may be peeled away from the electrically conductive substrate by first bonding them to another substrate to provide sufficient grip to remove the nanowires and/or the polymer resin from the electrically conductive substrate. The second substrate may be a substrate intended to support an electrical circuit, and the nanowires may be used as circuit elements in the circuit.

While the examples above have been described with reference to specific nanowire materials and shapes, any appropriate nanowire material and/or shape may be used in accordance with the principles described herein. For example, the nanowires formed with the principles described herein may be used with mesh shapes, curved shapes, linear shapes, zigzag shapes, triangular shapes, or combinations thereof. Further, the nanowires formed with the principles described herein can be formed with circular cross sections, rectangular cross sections, triangular cross sections, symmetric cross sections, asymmetric cross sections, other cross sections, or combinations thereof. Also, while the examples above have been described with reference to specific types of polymer resins, any appropriate type of polymer resins may be used.

The examples above have been described with reference to specific procedures that have occurred in specific orders. However, any appropriate order of such procedures may be used according to the principles described herein. The nanowires' dimensions are precisely controlled with the lithographic formation of both the trench and the electroplating or electroless deposition. While the examples above have been described with reference to specific removal mechanisms, any removal mechanism in accordance with the principles described herein may be used.

Some of the advantages of the principles described herein for producing nanowires is a reliable, low cost way to precisely control of the nanowire's geometry and in particular the ability to generate nanowires with a very high aspect ratio. Other production methods generate a wide distribution of lengths and diameters, all of which affect the performance in the final nanowires. The principles described herein allow for the manufacture of the nanowire with any appropriate metal that can be deposited through electro or electroless deposition such as nickel, copper, gold, silver, other metals, alloys thereof, mixtures thereof, or combinations thereof. In other applications where individual nanowires form electrically conductive pathways in nanoscale circuit components, the precisely formed geometry of the nanowires will allow precise matching to circuit architectures. The percolation threshold for a network formed from random networks of nanowires is dependent on their geometries and control of their length and diameter. The principles described herein allow for smaller percolation thresholds allowing for relatively less expensive materials to be used to generate highly transparent conductive films.

As this approach uses lithographically formed trenches, there is no limit on the length of the nanowire that can be produced. The principles described herein avoid the use of corrosive etchants such as hydrofluoric acid for forming the trenches. Thus, the principles described herein allow for the manufacture of nanowires that is more compatible with metallic nanowire materials.

When electroplating is combined with nanoimprint technology, these principles also lower production costs for nanowire manufacturing. Nanowires made with the principles described herein are good candidates for early adoption for producing flexible transparent conductive films for display applications and other transparent applications.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for controlling dimensions of nanowires, comprising:
    placing a light mask on a layer of polymer resin;
    using optical lithography with the light mask, photolithographically forming a trench in the layer of a polymer resin, the trench having sidewalls and a bottom with a width less than one micrometer and a length corresponding to a desired length of a nanowire to be formed, said polymer resin being deposited over an electrically conductive substrate;
    exposing a surface of the conductive substrate at the bottom and between the sidewalls of the trench;
    depositing a metallic nanowire material by electroplating within said trench over the exposed surface of the conductive substrate at the bottom of the trench to form a metallic nanowire longitudinally along said substrate, a length of said nanowire corresponding to a length of said trench; and
    removing said nanowire from said substrate with a removal mechanism.

2. The method of claim 1, further comprising forming an electrically conductive pathway between a first electrode and a second electrode spaced, apart by a distance from one another, by applying a liquid solution, carrying said nanowire, between said first and second electrode.

3. The method of claim 2, wherein said nanowire is at least as long as said distance.

4. The method of claim 1, wherein depositing said nanowire material within said trench to form said nanowire includes depositing a first material into said trench and depositing a second, different material over said first material within said trench.

5. The method of claim 1, wherein depositing said nanowire material within said trench to form said nanowire includes forming said nanowire with any of direct current electroplating, pulse electroplating, and reverse electroplating.

6. The method of claim 1, wherein said trench comprises a length to width aspect ratio of at least one to a thousand.

7. The method of claim 1, wherein removing said nanowire from said substrate comprises use of a substrate degradation mechanism that includes dissolving said substrate in a solvent.

8. The method of claim 1, wherein removing said nanowire from said substrate includes peeling said polymer resin and said nanowire away from said electrically conductive substrate.

9. The method of claim 8, wherein peeling said polymer resin and said nanowire away from said electrically conductive a bstrate includes bonding a second substrate to said polymer resin and said nanowire.

10. The method of claim 1, wherein a width of said trench is between 1 and 300 nanometers.

11. A method for controlling dimensions of nanowires, comprising:
    placing a light mask on a layer of polymer resin to selective expose portions of the layer of polymer resin where a trench is to be formed;
    using the light mask, photolithographically forming a trench in the layer of a polymer resin with a width less than one micrometer, said polymer resin comprising a thickness less than one micrometer and being deposited over an electrically conductive substrate;
    depositing a metallic nanowire material within said trench to form a nanowire; and
    removing said nanowire from said substrate with a removal mechanism to obtain said nanowire.

12. The method of claim 11, wherein depositing said nanowire material comprises electroless deposition for depositing said material at a bottom of said trench.

13. The method of claim 11, further comprising forming an electrically conductive pathway between a first electrode and a second electrode spaced apart from one another by applying a liquid solution carrying said nanowire between said first and second electrode.

14. The method of claim 11, wherein depositing said nanowire material within said trench to form said nanowire includes forming said nanowire with electroplating, electroless deposition, or combinations thereof.

15. The method of claim 11, wherein depositing said nanowire material within said trench to form said nanowire includes depositing a first material into said trench and depositing a second material over said first material within said trench.

* * * * *

UNITED STATES PATENT AND TRADEMARK OFFICE
CERTIFICATE OF CORRECTION

PATENT NO.         : 9,631,291 B2
APPLICATION NO.    : 13/752868
DATED              : April 25, 2017
INVENTOR(S)        : Scott et al.

Page 1 of 1

It is certified that error appears in the above-identified patent and that said Letters Patent is hereby corrected as shown below:

In the Claims

In Column 10, Line 15 approx., in Claim 9, delete "a bstrate" and insert -- substrate --, therefor.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*